(12) United States Patent
Chang et al.

(10) Patent No.: US 12,356,742 B2
(45) Date of Patent: Jul. 8, 2025

(54) CHIP PACKAGING STRUCTURE AND CHIP PACKAGING METHOD

(71) Applicant: TONG HSING ELECTRONIC INDUSTRIES, LTD., Taipei (TW)

(72) Inventors: You-Wei Chang, Taipei (TW); Chien-Chen Lee, Taipei (TW); Li-Chun Hung, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 451 days.

(21) Appl. No.: 17/968,112

(22) Filed: Oct. 18, 2022

(65) Prior Publication Data
US 2024/0088179 A1     Mar. 14, 2024

(30) Foreign Application Priority Data
Sep. 8, 2022   (TW) .................................. 111134197

(51) Int. Cl.
*H10F 39/00*   (2025.01)
(52) U.S. Cl.
CPC ......... *H10F 39/804* (2025.01); *H10F 39/011* (2025.01); *H10F 39/811* (2025.01)
(58) Field of Classification Search
CPC ..... H10F 39/804; H10F 39/011; H10F 39/811
See application file for complete search history.

(56) References Cited

U.S. PATENT DOCUMENTS

| | | | | |
|---|---|---|---|---|
| 2017/0345864 A1* | 11/2017 | Kinsman | ................. | H10F 39/18 |
| 2020/0312897 A1* | 10/2020 | Hsieh | ................. | H10F 39/804 |
| 2020/0411574 A1* | 12/2020 | Chang | ................. | H10F 39/028 |
| 2021/0305301 A1* | 9/2021 | Hsieh | ................. | H10F 39/804 |
| 2022/0123035 A1* | 4/2022 | Seo | ................. | H10F 39/026 |

* cited by examiner

*Primary Examiner* — Kyoung Lee
*Assistant Examiner* — Sophia W Kao
(74) *Attorney, Agent, or Firm* — Birch, Stewart, Kolasch & Birch, LLP

(57) ABSTRACT

A chip packaging structure and a chip packaging method are provided. The chip packaging structure includes a first substrate, an image sensing chip, a supporting member, a second substrate, and an encapsulant. The image sensing chip is disposed on an upper surface of the first substrate, and the image sensing chip has an image sensing region. The supporting member is disposed on an upper surface of the image sensing chip and surrounds the image sensing region. The supporting member is formed by stacking microstructures with each other, so that the supporting member has pores. The second substrate is disposed on an upper surface of the supporting member, and the second substrate, the supporting member, and the image sensing chip define an air cavity. The encapsulant is attached to the upper surface of the first substrate and a side surface of the second substrate and filled into the pores.

10 Claims, 8 Drawing Sheets

CHIP PACKAGING STRUCTURE AND CHIP PACKAGING METHOD

CROSS-REFERENCE TO RELATED APPLICATION

This non-provisional application claims priority under 35 U.S.C. § 119(a) to Patent Application No. 111134197 filed in Taiwan, R.O.C. on Sep. 8, 2022, the entire contents of which are hereby incorporated by reference.

BACKGROUND

Technical Field

The instant disclosure relates to a chip packaging structure and a method for manufacturing a chip packaging structure.

Related Art

Owing to the developments and innovations in autonomous driver assistance systems and smartphones, markets request increased performances for CMOS image sensing chips. In general, a chip with a higher performance has a greater packaging size and a greater size of the air cavity in the packaging structure. Besides, during the manufacturing process of the chip with a higher performance, a much severer heat effect occurs.

For a packaging structure for a CMOS image sensing chip known to the inventor, the glue is applied to dispose a frame component (which is so called as a dam) on an upper surface of the CMOS image sensing chip and surround the image sensing region at a center portion of the CMOS image sensing chip, and a cover glass is disposed on the dam, so that the image sensing region of the CMOS image sensing chip is sealed within a hermetic space defined by the cover glass and the dam. However, since both the cover glass and the dam body are not air-permeable elements, after other thermal treatment processes are applied to the packaged product, the internal pressure of the hermetic space increases, so that a pressure difference is formed between the hermetic space and the ambient environment, and the pressure difference would cause the dam to delaminate from the CMOS image sensing chip, thus affecting the yield of the packaged products.

SUMMARY

In view of this, in one embodiment, a chip packaging structure is provided. The chip packaging structure comprises a first substrate, an image sensing chip, a supporting member, a second substrate, and an encapsulant. The image sensing chip is disposed on an upper surface of the first substrate, and the image sensing chip has an image sensing region. The supporting member is disposed on an upper surface of the image sensing chip and surrounds the image sensing region, and the supporting member is formed by stacking a plurality of microstructures with each other, so that the supporting member has a plurality of pores. The second substrate is disposed on an upper surface of the supporting member, and the second substrate, the supporting member, and the image sensing chip define an air cavity. The encapsulant is attached to the upper surface of the first substrate and a side surface of the second substrate, and the encapsulant is filled into the pores of the supporting member.

In another embodiment, a chip packaging method is also provided. The method comprises: disposing an image sensing chip on an upper surface of a first substrate, wherein the image sensing chip has an image sensing region; disposing a supporting member on a lower surface of a second substrate, wherein the supporting member is formed by stacking a plurality of microstructures with each other, so that the supporting member has a plurality of pores; disposing the second substrate and the supporting member on the image sensing chip, wherein the lower surface of the second substrate faces the image sensing chip, the supporting member is attached to an upper surface of the image sensing chip and surrounds the image sensing region, and the second substrate, the supporting member, and the image sensing chip define an air cavity; and dispensing an encapsulant so that the encapsulant is attached to the upper surface of the first substrate and a side surface of the second substrate, and the encapsulant is filled into the pores of the supporting member.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1A:
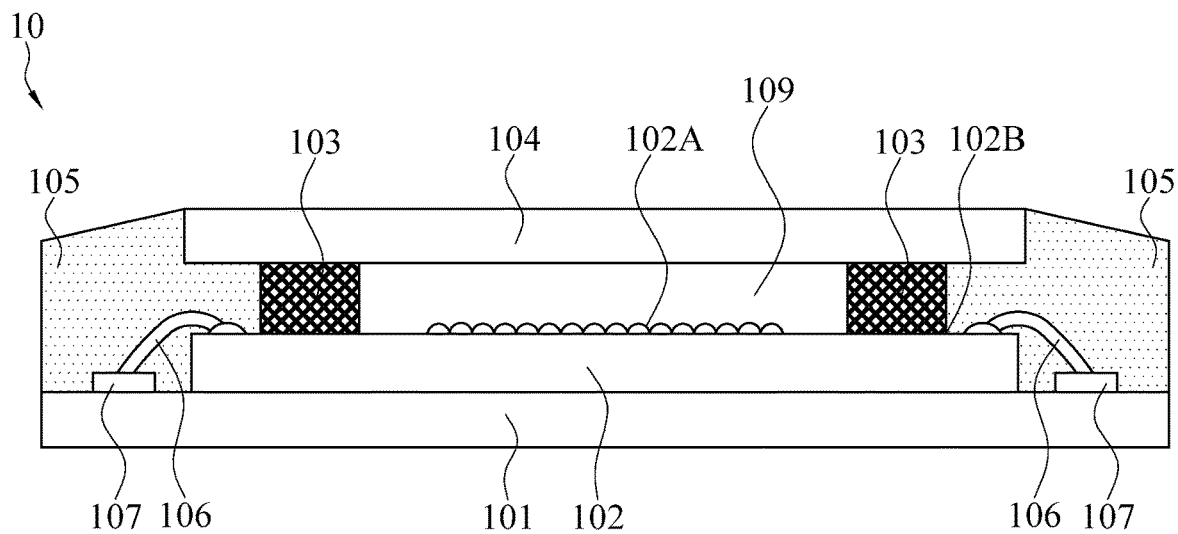
FIG. 1A illustrates a schematic view of a chip packaging structure according to a first embodiment of the instant disclosure.

FIG. 1A illustrates a schematic view of a chip packaging structure according to a first embodiment of the instant disclosure. Please refer to FIG. 1A. The chip packaging structure 10 comprises a first substrate 101, an image sensing chip 102, a supporting member 103, a second substrate 104, and an encapsulant 105. The image sensing chip 102 is disposed on an upper surface of the first substrate 101, and the image sensing chip 102 has an image sensing region 102A. The supporting member 103 is disposed on an upper surface of the image sensing chip 102 and surrounds the image sensing region 102A. The second substrate 104 is disposed on an upper surface of the supporting member 103, and the second substrate 104, the supporting member 103, and the image sensing chip 102 define an air cavity 109. The encapsulant 105 is attached to the upper surface of the first substrate 101 and a side surface of the second substrate 104.

The first substrate 101 may be made of resin (or a mixture of resin and glass fibers), ceramic, or glass. In some embodiment, the first substrate 101 is made of silicon nitride ($Si_3N_4$), aluminum oxide ($Al_2O_3$), aluminum nitride (AlN), zirconium dioxide ($ZrO_2$), zirconium toughed alumina (ZTA), beryllium oxide (BeO), or other ceramics. Therefore, the first substrate 101 has the advantages of higher structural strength, higher thermal conductivity, lower warpage, lower thermal expansion coefficient (for example, aluminum oxide with a thermal expansion coefficient of $8\times10^{-6}/°$ C. or aluminum nitride with a thermal expansion coefficient of $5.0\times10^{-6}/°$ C. may be adopted), and good electrical insulation. In some embodiments, the first substrate 101 is a double-sided circuit substrate, and traces are provided on the upper surface and a lower surface of the first substrate 101 for being electrically connected to the electronic components on the upper surface or the lower surface of the first substrate 101, respectively.

The image sensing chip 102 is an integrated circuit (IC) chip, and the image sensing chip 102 may be image sensing chip for visible light or invisible light. To facilitate light transmission, in some embodiments, the second substrate 104 is made of a light transmissive material, and the light transmissive material may be one or a mixture of the material(s) selected from the group consisting of glass, poly(methyl methacrylate) (PMMA), polystyrene (PS), polycarbonate (PC), diallyl glycol carbonates CR-39, acrylonitrile-styrene copolymer (SAN), poly(4-methyl-1-pentene) (TPX) and transparent polyamide (PA). The second substrate 104 may be formed as a planar lens, a convex lens, or a concave lens.

The encapsulant 105 may be epoxy, polyimide (PI), or silicone. The encapsulant 105 is provided to cover and protect the conductive wire 106 so as to prevent moisture from entering the air cavity 109 into the chip packaging structure. Alternatively, the encapsulant 105 is provided to form an opaque layer to block the ambient light from entering the package so as to prevent the stray lights. The method for forming the encapsulant 105 may adopt the dispensing procedure, so that the encapsulant 105 which has high mobility and is not solidified yet covers the structure to be packaged. The encapsulant 105 covers a side surface of the second substrate 104. In some embodiments, the encapsulant 105 covers ½ to ⅔ of the height of the side surface of the second substrate 104.

The material of the supporting member 103 may be one or a mixture of the material(s) selected from the group consisting of polyurethane (PU), polyacrylonitrile (PAN), polyvinyl alcohol (PVA), polylactide (PLA), polyethylene oxide (PEO), polyethylene terephthalate (PET), polyvinyl pyrrolidone (PVP), polyvinyl chloride (PVC), cellulose acetate (CA), poly(lactic-co-glycolic acid) (PLGA), polycaprolactone (PCL), polyethylene glycol (PEG), polydimethylsiloxane (PDMS), glass fiber, PS, PMMA, PA, and PA 6.6.

The supporting member 103 is formed by a plurality of microstructures, so that the supporting member 103 has a plurality of pores 1031. When the supporting member 103 is attached to the image sensing chip 102 and the second substrate 104 to form the hermetic air cavity 109, the pores 1031 of the supporting member 103 allow ventilation, so that the pressure generated owing to the air expansion during the thermal treatment process can be balanced with the pressure in the air cavity 109. For example, when the image sensing chip 102 is attached to the upper surface of the first substrate 101 through an adhesive, or when the second substrate 104 is attached to the upper surface of the supporting member 103 through an adhesive, a thermal curing process has to be applied to the adhesive to solidify the adhesive, and the pores 1031 of the supporting member 103 thus can facilitate the pressure equilibrium during the thermal curing process. The adhesive may adopt epoxy, polyimide, or silicone. In this embodiment, when choosing the material of the supporting member 103, the solidification temperature and the solidification time of the adhesive and the intrinsic property of the material have to be considered. In detail, in this embodiment, the solidification temperature of the adhesive has to be less than the melting point of the material of the supporting member 103. In one embodiment, the solidification temperature of the adhesive is less than the glass transition temperature (T g) of the material of the supporting member 103 so as to prevent the pores 1031 from collapsing during the thermal treatment process. As a result, in some embodiments, adopting a material having a higher melting point or a higher T g or mixing a several materials of the supporting member 103 to form the supporting member 103 may be considered. Alternatively, in some embodiments, decreasing the solidification temperature of the adhesive and extending the solidification time of the adhesive may be considered.

Figure 1B:
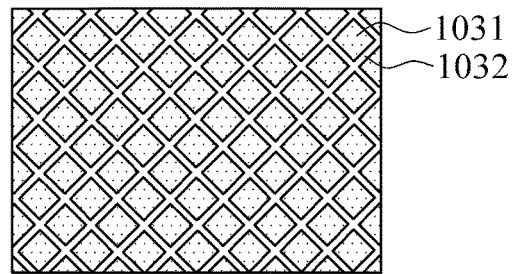
FIG. 1B illustrates a schematic view of a plurality of microstructures according to the first embodiment of the instant disclosure.
Figure 1C:
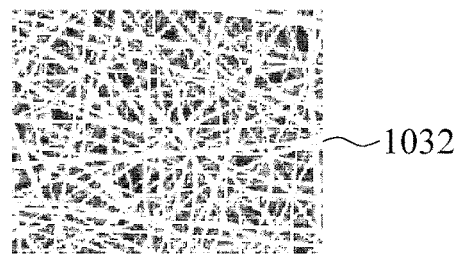
FIG. 1C shows a photograph of intertwined fibers according to the first embodiment of the instant disclosure.
Figure 2A:
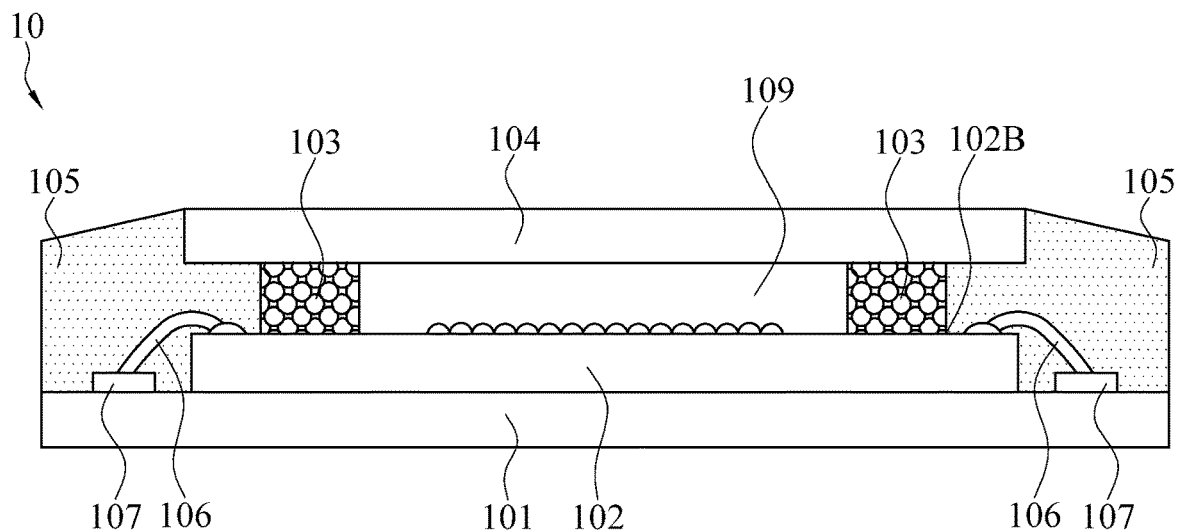
FIG. 2A illustrates a schematic view of a chip packaging structure according to a second embodiment of the instant disclosure.
Figure 2B:
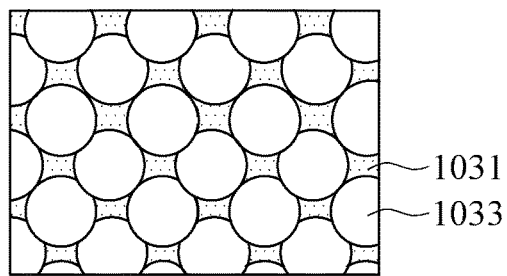
FIG. 2B illustrates a schematic view of a plurality of microstructures according to the second embodiment of the instant disclosure.
Figure 2C:
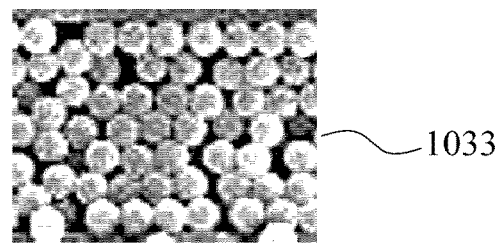
FIG. 2C shows a photograph of stacked particles according to the second embodiment of the instant disclosure.

FIG. 1B illustrates a schematic view of a plurality of microstructures according to the first embodiment of the instant disclosure. Please refer to FIG. 1B. In the first embodiment, the microstructures are formed by intertwining a single fiber 1032 or by stacking and intertwining several fibers 1032 with each other. The microstructures may be indicated by the gaps formed between the intertwined fibers 1032, and the gaps are in communication with each other to form the pore 1031. It is understood that, though in the schematic view shown in FIG. 1B, the microstructures are arranged orderly and each have the same appearance and dimension, but the instant disclosure is not definitely limited thereto. FIG. 1C shows a photograph of intertwined fibers according to the first embodiment of the instant disclosure. Please refer to FIG. 1C. In this embodiment, the fibers 1032 are intertwined to form a plurality of gaps, and the appearance and the dimension of the gaps are not the same, while the gaps are in communication with each other to form the pore 1031 so as to constitute the microstructures. FIG. 2A illustrates a schematic view of a chip packaging structure according to a second embodiment of the instant disclosure. FIG. 2B illustrates a schematic view of a plurality of microstructures according to the second embodiment of the instant disclosure. Please refer to FIG. 2A and FIG. 2B. The difference between the second embodiment and the first embodiment is mainly the structure of the supporting member 103. In the second embodiment, the microstructures are formed by stacking a plurality of particles 1033, and the microstructure may be indicated by the particle 1033. Several gaps are formed between the particles 1033, and the gaps are in communication with each other to form the pore 1031. It is understood that, though in the schematic view shown in FIG. 2B the microstructures are arranged orderly and each have the same appearance and dimension, the instant disclosure is not definitely limited thereto. FIG. 2C shows a photograph of stacked particles according to the second embodiment of the instant disclosure. Please refer to FIG. 2C. In this embodiment, the particles 1033 are not stacked orderly, so that the appearance and the dimension of the gaps between the particles 1033 are not the same, while the gaps are in communication with each other to form the pore 1031. Moreover, the outline of the particle 1033 is not necessarily to be circular or share the same dimension; the outline of the particle 1033 can be configured to allow the gaps between the particles 1033 to be in communication with each other to form the pore 1031.

The microstructures of the supporting member 103 not only allow the ventilation but also allow the encapsulant 105 to be filled herein. After the pores 1031 are sealed by the encapsulant 105, the air cavity 109 in the chip packaging structure 10 is isolated from the ambient environment, so that moisture can be prevent from entering the air cavity 109 to damage the image sensing chip 102. Moreover, the structural strength of the supporting member 103 can be increased. Based on the above, according to one or some embodiments of the instant disclosure, when packaging the image sensing chip 102, the configuration of the supporting member 103 addresses the issue that the chip packaging structure 10 is damaged owing to the air expansion in the air cavity 109 during the thermal treatment process. Furthermore, after the thermal treatment process, the supporting member 103 also allows the encapsulant 105 to be filled herein to seal the air cavity 109 in the chip packaging structure 10.

Figure 3A:
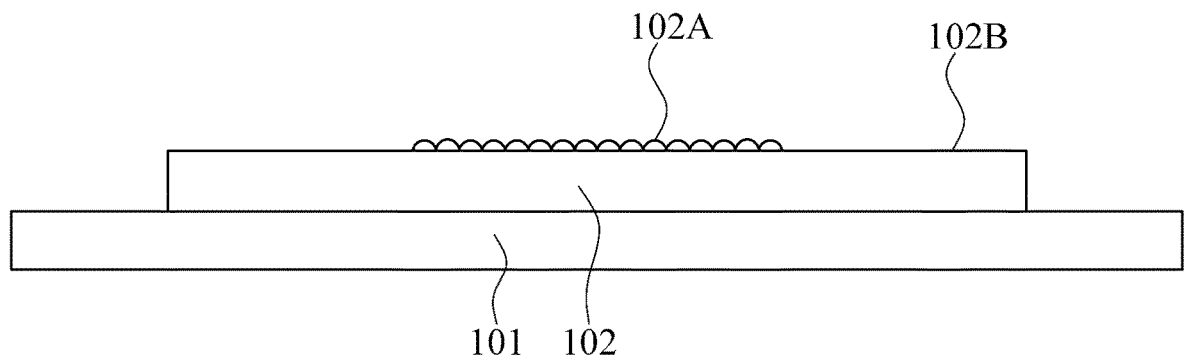
FIG. 3A to FIG. 3G illustrate schematic views showing the manufacturing process of a chip packaging structure according to some embodiments of the instant disclosure.

In the following paragraphs, the manufacturing process of the chip packaging structure 10 is illustrated with various embodiments. FIG. 3A to FIG. 3G illustrate schematic views showing the manufacturing process of a chip packaging structure according to some embodiments of the instant disclosure. Please refer to FIG. 3A to FIG. 3G in order according to the following paragraphs. In some embodiments, as shown in FIG. 3A, after the chip packaging method provides a first substrate 101 (the step 1), the method comprises disposing an image sensing chip 102 on an upper surface of the first substrate 101, wherein the image sensing chip 102 has an image sensing region 102A (the step 2). The position of the image sensing chip 102 may be determined based on a predetermined location on the first substrate 101. The image sensing chip 102 and the first substrate 101 are electrically connected to each other by conductive wires 106. In some embodiments, the image sensing chip 102 and the upper surface of the first substrate 101 are adhered to each other through adhesive.

Figure 3B:
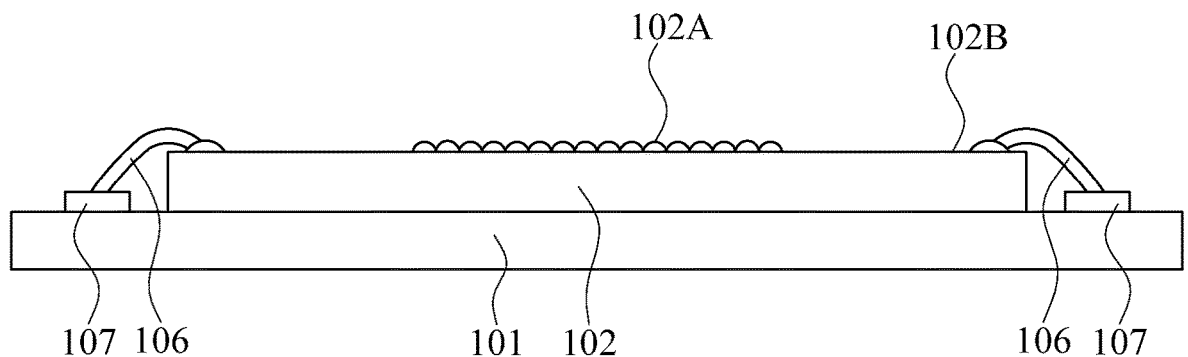

As shown in FIG. 3B, in some embodiments, the method comprises electrically connecting the image sensing chip 102 to contacts 107 of the first substrate 101 by wire bonding (the step 3). In other embodiments, the image sensing chip 102 may be electrically connected to the first substrate 101 with other connection manners. The conductive wire 106 may be made of gold, copper, silver, palladium-copper alloy, or other metals.

Figure 3C:
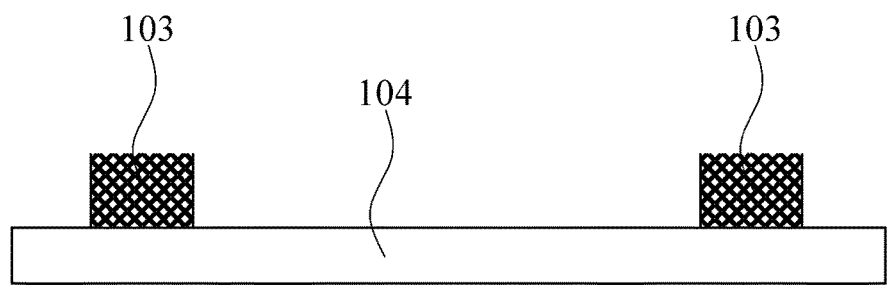

As shown in FIG. 3C, the method comprises disposing a supporting member 103 on a surface of a second substrate 104 (the step 4). It is noted that, the supporting member 103 may be formed in advance and then disposed on the surface of the second substrate 104, or the supporting member 103 may be directly formed on the surface of the second substrate 104. Moreover, the supporting member 103 may also be formed in advance and then disposed on the upper surface of the image sensing chip 102, or the supporting member 103 may be directly formed on the upper surface of the image sensing chip 102. The image sensing chip 102 comprises an image sensing region 102A and a non-image sensing region 102B, and the supporting member 103 is disposed on the non-image sensing region 102B surrounding the image sensing region 102A. In some embodiments, the supporting member 103 and the surface of the second substrate 104 are adhered to each other through thermosetting adhesive.

Figure 3D:
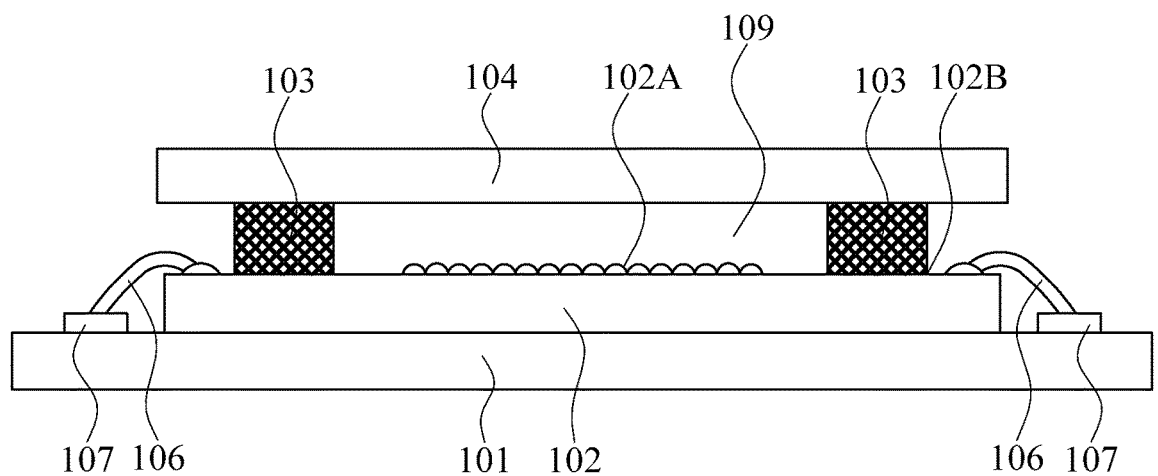

As shown in FIG. 3D, the method comprises disposing the second substrate 104 and the supporting member 103 on the upper surface of the image sensing chip 102 (the step 5). In some embodiments, the supporting member 103 and the upper surface of the image sensing chip 102 are also adhered to each other by thermosetting adhesive. In this embodiment, the second substrate 104, the supporting member 103, and the image sensing chip 102 together form an air cavity 109, and the air cavity 109 is in communication with the outside of the air cavity 109. Therefore, the method comprises allowing a thermal treatment process (the step 6) to be applied to the chip packaging structure 10. For example, the adhesive between the image sensing chip 102 and the first substrate 101, and/or the adhesive between the supporting member 103 and the image sensing chip 102, and/or the adhesive between the supporting member 103 and the second substrate 104, can be solidified by the thermal treatment. Hence, the entire chip packaging structure 10 can be steadily formed.

Figure 3E:
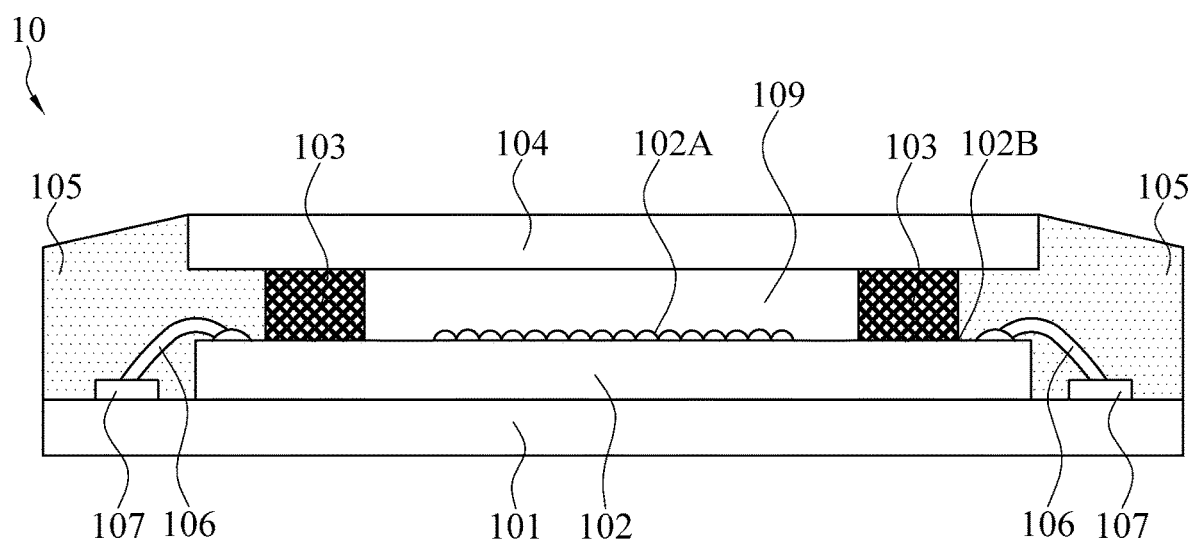

As shown in FIG. 3E, after the structure applied with the thermal treatment is configured in a mold, the method comprises dispensing an encapsulant 105 in the structure to achieve the dispensing process (the step 7). The encapsulant 105 is attached to the upper surface of the first substrate 101 and a side surface of the second substrate 104, and the encapsulant 105 is filled into the pores 1031 of the supporting member 103. In some embodiments, the second substrate 104 is made of light transmissive material, so that the user or the inspection apparatus can ensure the condition of the inner wall of the supporting member 103 around the air cavity 109 through the second substrate 104. During the process of dispensing the encapsulant 105, when the user or the inspection apparatus determines that the encapsulant 105 instantly exudes from the inner side surface of the supporting member 103 (the inner wall of the air cavity 109), the dispensing apparatus stop dispensing the encapsulant 105. In some embodiments, the dispensing of the encapsulant 105 may be controlled in terms of the dispensing time and the dispensing amount of the encapsulant 105.

Figure 3F:
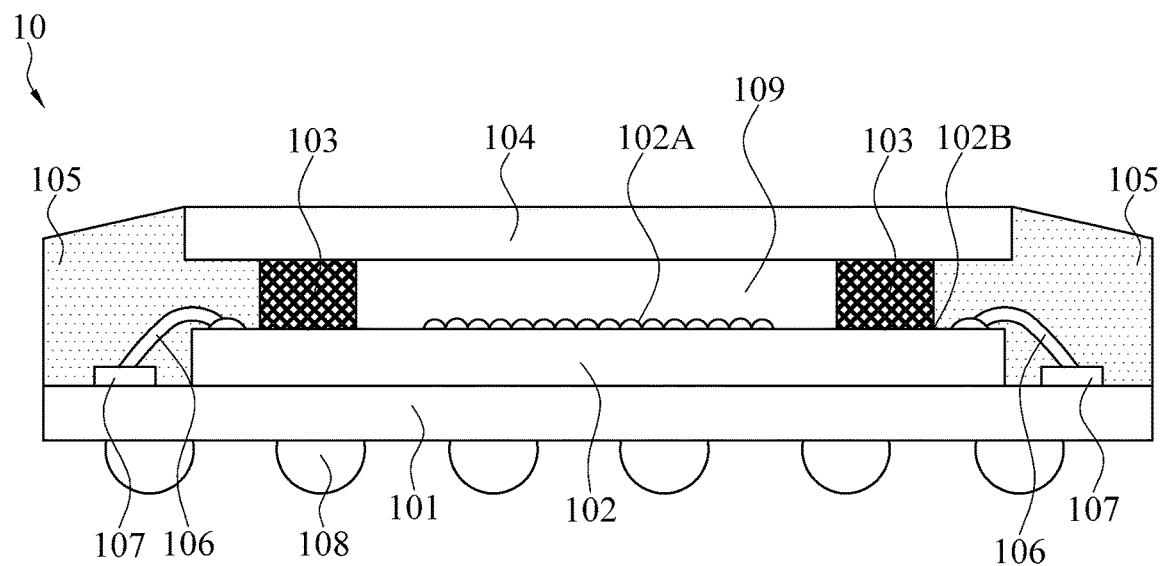

As shown in FIG. 3F, for the sake of inspecting the product function conveniently, in some embodiments, the method comprises disposing a pin (such as a solder ball 108) on a lower surface of the first substrate 101 (the step 8). The detecting current signals are inputted into the image sensing chip 102 through some of the pins and the conductive wires 106, and the generated feedback signals in response to the processing of the detecting current signals carried out by the image sensing chip 102 are outputted through the rest of the pins, so that the testing apparatus can determine whether the function of the chip packaging structure 10 is normal or not.

Figure 3G:
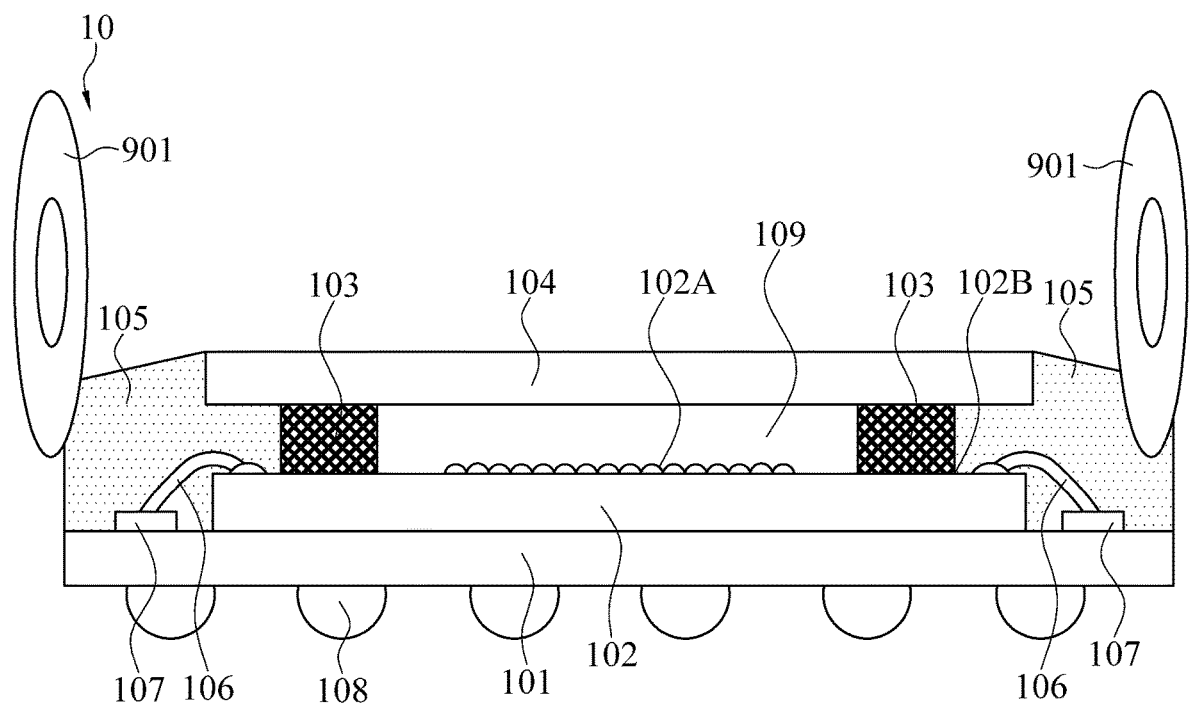

As shown in FIG. 3G in some embodiments, the method comprises dicing the packaging structure that is fabricated with the aforementioned processes with a dicing device 901 to form individual packaging units (the step 9), so that the manufacturing process of the chip packaging structure 10 can be achieved.

It is understood that, the manufacturing process of the chip packaging structure shown in FIG. 3A to FIG. 3G are merely one of the feasible manufacturing processes of the chip packaging structure 10; the steps 1 to 9 does not have to carry out rigidly in accordance with the aforementioned descriptions or the illustrated drawings, and the order of the steps are not definitely the same as the aforementioned descriptions. For example, in the step 4 and the step 5, the supporting member 103 may be pre-formed in advance and then disposed on the upper surface of the image sensing chip 102, or the supporting member 103 may be directly formed on the upper surface of the image sensing chip 102. Therefore, in some embodiments, the supporting member 103 may be formed on a target surface. The target surface may be the lower surface of the second substrate 104 (the surface of the second substrate 104 facing the image sensing chip 102) or the upper surface of the image sensing chip 102 (the surface of the image sensing chip 102 facing the second substrate 104). In the following paragraphs, the way of how the supporting member 103 is formed on the target surface is illustrated with various embodiments.

Figure 4A:
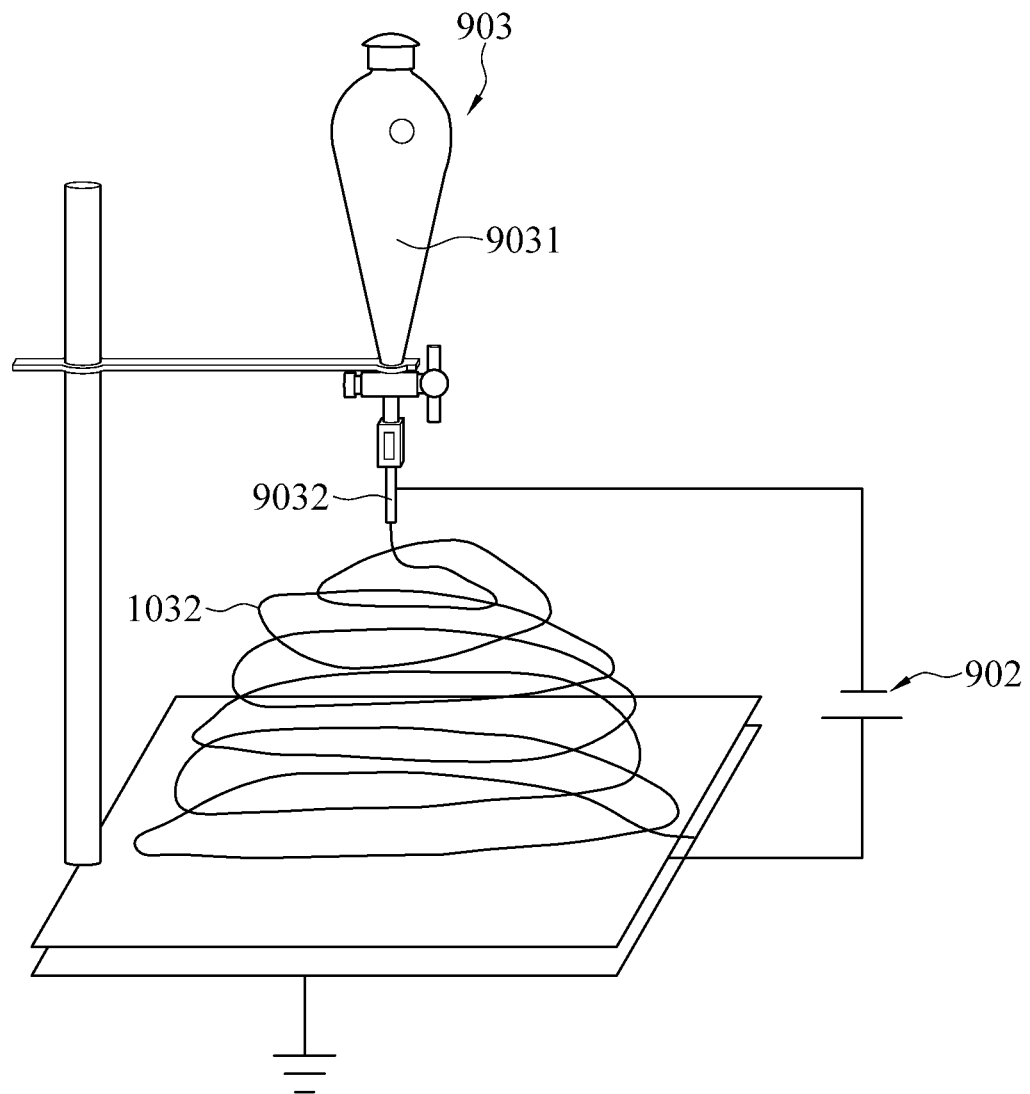
FIG. 4A to FIG. 4C illustrates schematic views showing the manufacturing process of a supporting member according to the first embodiment of the instant disclosure.
Figure 4B:
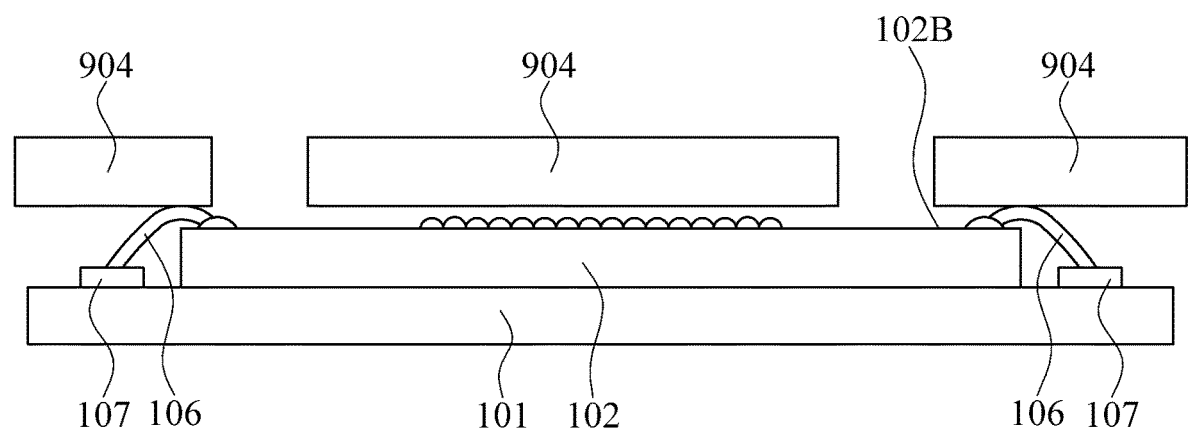
Figure 4C:
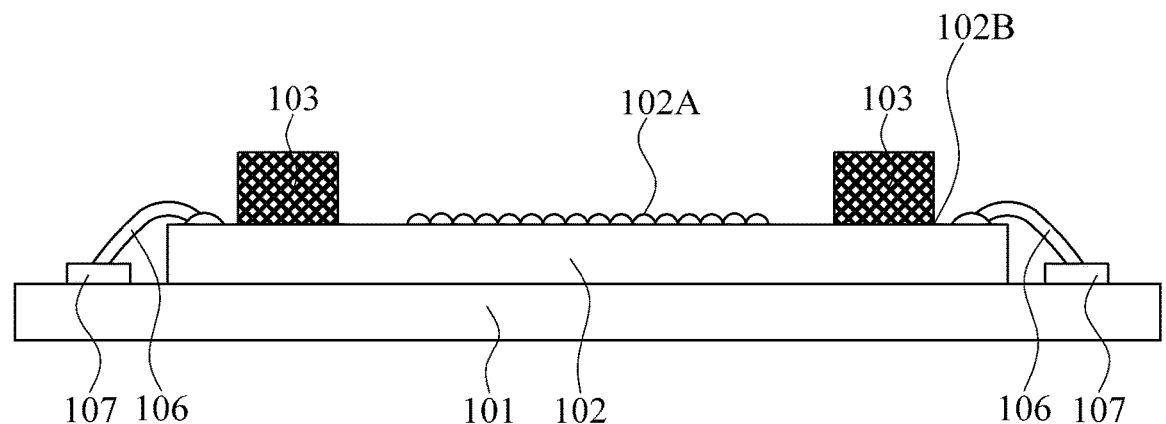

As shown in FIG. 1B, the microstructures in the first embodiment are formed by one or several intertwined fibers 1032. FIG. 4A to FIG. 4C illustrates schematic views showing the manufacturing process of a supporting member according to the first embodiment of the instant disclosure. In the manufacturing process shown in FIG. 4A to FIG. 4C, the supporting member 103 is formed on the target surface by applying the electrospinning technique. Please refer to FIG. 4A to FIG. 4C in order according to the following paragraphs. In some embodiments, to form the intertwined fibers 1032, as shown in FIG. 4A, an injector 903 is provided above the target surface. The injector 903 comprises a receiving cavity 9031 and a metal needle 9032. The receiving cavity 9031 is adapted to receive a polymer 1034, and the material of the receiving cavity 9031 may be metal, glass, or ceramic. A voltage source 902 is serially connected to the metal needle 9032 of the injector 903 and the target surface, so that an electric potential difference is generated between the metal needle 9032 and the target surface. The polymer 1034 may be selected from one or several of the materials that are used for forming the supporting member 103. When the injector 903 releases the polymer 1034, the polymer 1034 is guided by the electric field so as to be solidified on the target surface to form the intertwined fibers 1032, thereby forming a plurality of microstructures. In some embodiments, in order to allow the polymer 1034 to be in an amorphous state or to adjust the dimension of the fibers 1032, the receiving cavity 9031 is heated to a temperature equal to or higher than the glass transition temperature T g or the melting point of the polymer (for example, the receiving cavity may be placed in a tank for cyclically heating the silicone oil (not shown)). In some embodiments, the polymer is dissolved in a solvent so as to keep its fluidity. For example, an aqueous solution of 10% PVA in deionized water is isothermally maintained at a temperature from 80 to 85 Celsius, an electric potential difference of 21 kV is provided, and a distance of 200 mm is maintained between the metal needle and the target surface. For example, a solution of 6% PAN in dimethylformamide (DMF) is isothermally maintained at a temperature of 32.2 Celsius, a potential difference of 8.9 kV is provided, and a distance of 70 mm is maintained between the metal needle and the target surface.

Before the step 4, a mask 904 may be disposed on the surface of the image sensing chip 102. As shown in FIG. 4B and FIG. 4C, the mask 904 has a hole, and the position of the hole corresponds to a position on the image sensing chip 102 where the supporting member 103 is to be formed thereon. In some embodiments, when the microstructures cover the shield 904, the microstructures also cover a portion of the surface of the image sensing chip 102 corresponding to the hole of the shield 904. After the mask 904 is removed, the supporting member 103 can be formed. In some other embodiments, the microstructures directly cover the surface of the image sensing chip 102, and after a laser cutting process, the supporting member 103 can be formed. In some embodiments, the mask 904 is disposed on the surface of the second substrate 104, so that the supporting member 103 can be formed on the lower surface of the second substrate 104. Alternatively, in some embodiments, the microstructures directly cover the lower surface of the second substrate 104, and then the laser cutting process is applied to form the supporting member 103.

Figure 5:
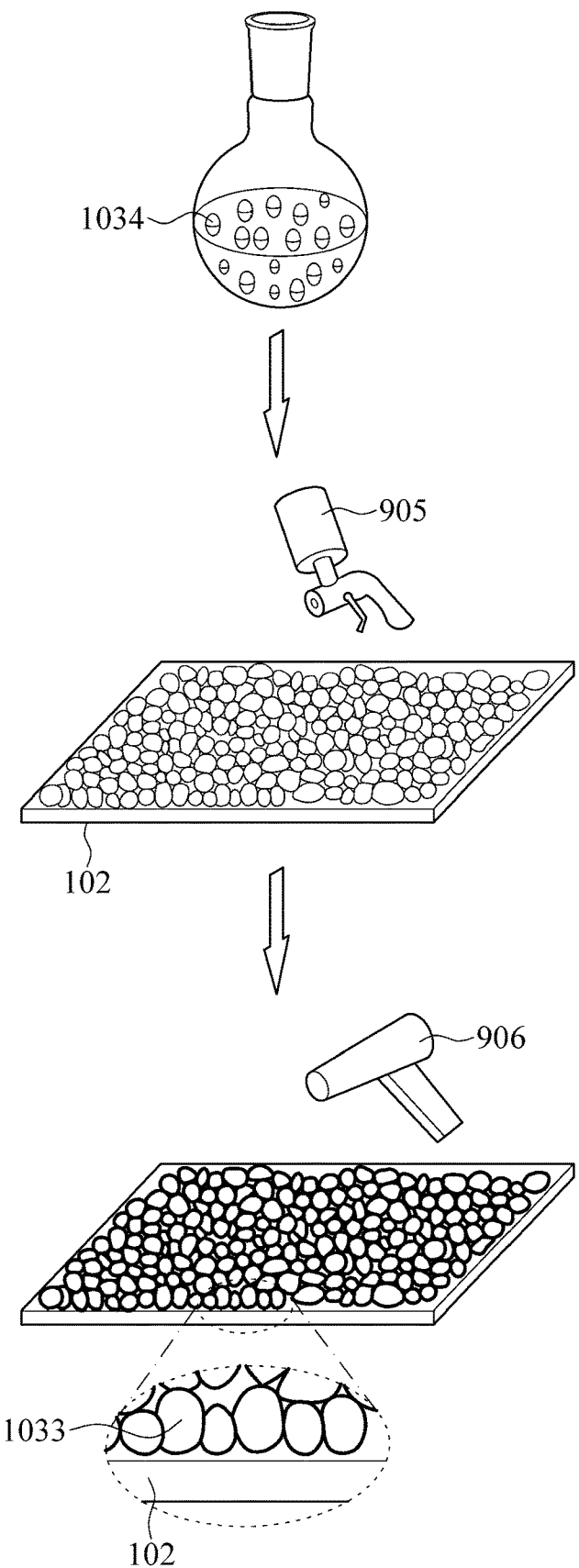
FIG. 5 illustrates a schematic view showing the manufacturing process of a supporting member according to the second embodiment of the instant disclosure.

As shown in FIG. 2B, the microstructures in the second embodiment are formed by several stacked particles 1033. FIG. 5 illustrates a schematic view showing the manufacturing process of a supporting member according to the second embodiment of the instant disclosure. Please refer to FIG. 5. In some embodiments, to form the stacked particles 1033, after the polymer 1034 is prepared in a solution, the solution is sprayed on the target surface (the surface of the image sensing chip 102 or the surface of the second substrate 104, where the surface is covered by or not covered by the mask 904) by a sprayer 905. Next, the particles 1033 formed on the target surface are heated and solidified by a heat gun 906, thus the first layer of the particles 1033 can be formed. Then, the spraying process and the heating and solidifying process are repeated, so that the microstructures can be formed. For example, a solution of 6.27% PDMS in ethyl acetate is mixed with 3 g starch (as the solubilizer), and the mixture is kept stirred for at least 5 minutes, a 0.2 MPa pressure is applied to the sprayer 905, and a distance of 150 to 200 mm is maintained between the sprayer 905 and the target surface. The heating and solidifying time of the heat gun 906 is equal to or more than 13 minutes.

In some other embodiments, the spraying process may be replaced by a dispensing process. In the dispensing process, the dispensing machine dispenses the solution of PDMS in ethyl acetate on the target surface (the surface of the image sensing chip 102 or the surface of the second substrate 104, where the surface is covered by or not covered by the mask 904). Next, the particles 1033 formed on the target surface are heated and solidified by a heat gun 906, thus the first layer of the particles 1033 can be formed. Then, the spraying process and the heating and solidifying process are repeated, so that the microstructures can be formed.

It is understood that, regarding the contents in the instant disclosure, the terms "upper", "lower", "inner", and "outer" are just provided for illustrating the relative relationship between the technical features or the elements of the embodiments, rather than limiting the elements to have an absolute positional relationship in the space. For example, regarding the implementation for disposing the second substrate on the supporting member, the second substrate may be directly placed on the supporting member, or the second substrate may be inverted, and then the supporting member is placed on the up-side down second substrate. While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:
1. A chip packaging structure comprising:
a first substrate;
an image sensing chip disposed on an upper surface of the first substrate, wherein the image sensing chip has an image sensing region;
a supporting member disposed on an upper surface of the image sensing chip and surrounding the image sensing region, wherein the supporting member is formed by stacking a plurality of microstructures with each other, so that the supporting member has a plurality of pores;

a second substrate disposed on an upper surface of the supporting member, wherein the second substrate, the supporting member, and the image sensing chip define an air cavity; and an encapsulant attached to the upper surface of the first substrate and a side surface of the second substrate, wherein the encapsulant is filled into the plurality of pores of the supporting member.

2. The chip packaging structure according to claim 1, wherein the plurality of microstructures is a plurality of fibers.

3. The chip packaging structure according to claim 1, wherein the plurality of microstructures is formed from a plurality of particles.

4. A chip packaging method comprising:

disposing an image sensing chip on an upper surface of a first substrate, wherein the image sensing chip has an image sensing region;

disposing a supporting member on a lower surface of a second substrate, wherein the supporting member is formed by stacking a plurality of microstructures with each other, so that the supporting member has a plurality of pores;

disposing the second substrate and the supporting member on the image sensing chip, wherein the lower surface of the second substrate faces the image sensing chip, the supporting member is attached to an upper surface of the image sensing chip and surrounds the image sensing region, and the second substrate, the supporting member, and the image sensing chip define an air cavity; and dispensing an encapsulant so that the encapsulant is attached to the upper surface of the first substrate and a side surface of the second substrate, and the encapsulant is filled into the plurality of pores of the supporting member.

5. The chip packaging method according to claim 4, wherein the step of disposing the supporting member on the lower surface of the second substrate comprises:

disposing a mask on the lower surface of the second substrate, wherein the mask has a hole, and a position of the mask allows the hole to correspond to a position on the lower surface of the second substrate where the supporting member is to be formed thereon;

forming the plurality of microstructures on the lower surface of the second substrate; and removing the mask to form the supporting member.

6. The chip packaging method according to claim 4, wherein the step of disposing the supporting member on the lower surface of the second substrate comprises:

forming the plurality of microstructures on the lower surface of the second substrate;

laser cutting the plurality of microstructures to form a pattern of the supporting member; and removing portions of the supporting member except the pattern of the supporting member.

7. The chip packaging method according to claim 5, wherein the step of forming the plurality of microstructures on the lower surface of the second substrate comprises:

providing an injector, wherein the injector comprises a receiving cavity and a metal needle, and the receiving cavity is adapted to receive a polymer;

applying a first electric potential on the metal needle;

applying a second electric potential on the lower surface of the second substrate; and releasing the polymer, so that the polymer is solidified on the lower surface of the second substrate to form a plurality of fibers intertwined with each other, thereby forming the plurality of microstructures.

8. The chip packaging method according to claim 5, wherein the step of forming the plurality of microstructures on the lower surface of the second substrate comprises:

dispensing a polymer on the lower surface of the second substrate to form a plurality of particles of a single layer;

solidifying the plurality of particles of a single layer to form a solidified particle layer;

dispensing the polymer on an upper surface of the solidified particle layer to form a plurality of particles of multiple layers; and solidifying the plurality of particles of multiple layers to form the plurality of microstructures.

9. The chip packaging method according to claim 5, wherein the step of forming the plurality of microstructures on the lower surface of the second substrate comprises:

spraying a polymer on the lower surface of the second substrate to form a plurality of particles of a single layer;

solidifying the plurality of particles of a single layer to form a solidified particle layer;

spraying the polymer on an upper surface of the solidified particle layer to form a plurality of particles of multiple layers; and solidifying the plurality of particles of multiple layers to form the plurality of microstructures.

10. The chip packaging method according to claim 4, wherein the second substrate is a lens, and wherein the step of dispensing the encapsulant comprises: inspecting an inner side surface of the supporting member through the lens, and when the encapsulant instantly exudes from the inner side surface of the supporting member, stop dispensing the encapsulant.

* * * * *